United States Patent
Blades

(10) Patent No.: US 6,882,158 B2
(45) Date of Patent: Apr. 19, 2005

(54) SERIES ARC FAULT DIAGNOSTIC FOR AIRCRAFT WIRING

(75) Inventor: Frederick K. Blades, Boulder, CO (US)

(73) Assignee: General Dynamics OTS (Aerospace) Inc., Redmond, WA (US)

(*) Notice: Subject to any disclaimer, the term of this patent is extended or adjusted under 35 U.S.C. 154(b) by 0 days.

(21) Appl. No.: 10/055,754

(22) Filed: Jan. 23, 2002

(65) Prior Publication Data

US 2002/0097056 A1 Jul. 25, 2002

Related U.S. Application Data

(60) Provisional application No. 60/296,734, filed on Jun. 11, 2001, provisional application No. 60/278,679, filed on Mar. 27, 2001, and provisional application No. 60/263,508, filed on Jan. 24, 2001.

(51) Int. Cl.[7] .................. G01R 31/12; G01R 31/08; G01R 31/02
(52) U.S. Cl. .................. 324/536; 324/539; 324/544
(58) Field of Search .................. 324/536, 537, 324/544, 541, 539, 509, 551

(56) References Cited

U.S. PATENT DOCUMENTS

| | | | |
|---|---|---|---|
| 5,223,795 A | 6/1993 | Blades | 324/536 |
| 5,323,117 A | * 6/1994 | Endoh et al. | 324/551 |
| 5,432,455 A | 7/1995 | Blades | 324/536 |
| 5,434,509 A | 7/1995 | Blades | 324/536 |
| 5,729,145 A | 3/1998 | Blades | 324/536 |
| 5,949,230 A | * 9/1999 | Kobayashi et al. | 324/72.5 |
| 6,130,540 A | * 10/2000 | Achatz | 324/536 |
| 2001/0052778 A1 | 12/2001 | Smith | 324/541 |
| 2001/0054902 A1 | 12/2001 | Smith et al. | 324/544 |

* cited by examiner

*Primary Examiner*—N. Le
*Assistant Examiner*—John Teresinski
(74) *Attorney, Agent, or Firm*—Howrey Simon Arnold & White, LLP

(57) ABSTRACT

A device for measuring the AC voltage drop across a series of connections under load with no direct electrical contact to the conductors. The presence of a substantial resistance at series contacts is indicative of a series arcing fault. The device comprises a capacitive probe for clamping to the outer insulation layer of the wire to sense a first voltage at a first node. The device further comprises a floating high-impedance meter having a ground reference coupled to the source of common-mode voltage at a second node, the floating high-impedance meter being adapted to measure a voltage difference between the two nodes and being further adapted to indicate the presence of the series fault when the measured voltage exceeds a predetermined level.

10 Claims, 9 Drawing Sheets

SERIES ARC FAULT DIAGNOSTIC FOR AIRCRAFT WIRING

CROSS-REFERENCES TO RELATED APPLICATIONS

This application claims the benefit of U.S. Provisional Application No. 60/263,508, filed Jan. 24, 2001; No. 60/278,679 filed Mar. 27, 2001; and No. 60/296,734 filed Jun. 11, 2001, which are expressly incorporated herein by reference.

FIELD OF THE INVENTION

The present invention relates to the detection of series faults in electrical wiring systems that may lead to electrical arcing. More specifically, it relates to diagnostic tools by which series faults in wiring systems can be revealed and located before they develop into arcing faults. Although principally developed for the diagnosis of wiring faults in aircraft wiring systems, these methods and tools apply directly to other fields including residential, industrial, and commercial power systems. In this patent the phrase "series fault" is used to refer to both abnormal series resistance at a contact junction and arcing that may result from that resistance.

BACKGROUND OF THE INVENTION

Series arc faults occur when loose or contaminated contacts begin arcing. The arc current is in series with the load and therefore limited to the load current. Common causes of series faults are contact overloading, the installation of a wrong pin type in a pin and socket connector, vibration loosening of contacts, and chemical or physical changes to the contact surfaces. Evidence that series arcing has occurred includes pitted contacts, heat damage to the insulation around the contacts, and overheating of the wires leading to the fault.

Often the only indication of an intermittent series fault is erratic operation of the load and/or radio interference caused by the arcing. When a pilot reports such symptoms and a ground technician attempts to reproduce them, it is not uncommon that everything will appear to be working fine. Often only particular environmental conditions (e.g., temperature, run time, load current, vibration, etc.) will get it arcing and cause it to fail in a noticeable manner. A contact that has been arcing, however, will generally exhibit higher than normal contact resistance when current is flowing through it. This is because arcing leaves tiny metallic bridges that constrict current flow and therefore show increased resistance. These bridges are chaotically broken and reformed from the heat of the arc during periods when it is arcing. In a subsequent stable period, the current is carried through one or two of these constricted bridges which, because they constrict the current flow, heat up. As their temperature rises, the resistance and therefore voltage across them increases. It is thus possible to discover a non-arcing series fault by measuring the voltage drop across each set of contacts under load.

A technician might diagnose such a problem by first measuring the voltage drop over the entire length of the cable which encompasses all the connections in between. The normal "acceptable" voltage drop under load might be on the order of a few millivolts. Much higher readings are indicative of a bad connection. If higher readings are found, the next step would be to locate the faulty connection by measuring the voltage drop across each connector progressively down the line. Or alternatively one might use a binary search, i.e., measure the drop from the halfway point to isolate it to one half or the other, then to successive halfway points until the fault is located. In either case, the principal problem the technician faces is that he cannot access the conductors to make the measurements. If he unplugs the connector to access the pins, he disconnects the load. Plugged in, the wires and contacts are typically not accessible. Even in the case where one can remove the connector shell to access contacts, doing so with power applied is not safe or practical. There exists a need, therefore, for a diagnostic means and method whereby such voltage drop measurements could be made is in situ under load and without access to the conductors.

SUMMARY OF THE INVENTION

The present invention is a portable battery-powered diagnostic tool that allows the measurement of AC voltage drops along a power distribution wire with no direct contact to the conductors. It is based first on the realization that relatively accurate voltage measurements can be made through a very small coupling capacitance, on the order of 1 to 10 picofarads. This coupling capacitance is formed by a small clamp-on probe, designed to make intimate contact between a flexible conductive layer in the probe and the outside of the wire insulation. Although the reactive impedance of a 10 picofarad capacitor is about 40 Mohms at 400 hz and about 265 Mohms at 60 hz, the methods and design of the present invention make possible accurate voltage measurements through this impedance.

The first aspect of the measuring circuits of the present invention is to use an amplifier with a high enough input impedance so that the corner frequency of the high-pass filter formed is well below the line frequency. This prevents the measured voltage from changing significantly even as the probe capacitance changes, due to clamp orientation, wire gauge and insulation thickness, and other factors.

The second design aspect that makes such a measurement practical is to locate the high-impedance amplifier in the probe, enclose it entirely in an electrostatic shield connected to circuit common, and drive this shield with the common-mode voltage, i.e., the line voltage. In other words, the circuit common of the battery-powered probe itself is driven at the line voltage by means of a long wire that is clipped onto the terminal of the circuit breaker that feeds the circuit. Since the probe itself is "hot," it is encased in plastic to insulate the user. In this manner, the circuit is single-ended and it is not responsive to stray capacitive coupling (significant when the actual coupling capacitance is only 10 pf or less) except at the probe itself.

Stray capacitive coupling is the main source of error in the present measurement system. Since the input to the amplifier is coupled to the wire under test by a mere 10 pf or less, the existence of say a 1 pf stray capacitance between the capacitive probe and ground, for example, will lead to a significant error. To counteract this, the flexible conductive layer that forms the outer plate of the probe capacitor is shielded by means of another conductive layer disposed around it with an insulating layer in between. This shielding layer, however, forms another capacitor that attenuates the signal of interest. Furthermore, to make the probe as small as possible, and therefore convenient to fit around wires in cramped places, this insulating layer should be as thin as possible. A third element of the present invention is to drive this probe shield with a guard voltage, that is, a voltage nearly equal to the measured voltage, to actively compensate for the effect of this added capacitance.

A fourth aspect to the present invention is the realization that even with stray capacitance causing some error in the measurement, useful voltage drop measurements can be made in a relative manner. When the load is turned off, the voltage drop across series contact resistances goes to zero. If some stray capacitance is present, however, the system may still show a small measured voltage. In accordance with the present invention this small voltage is taken as a zero offset and then difference measured as the load is turned on.

A contact that has been arcing, or is in the process of physical degradation that may lead to series arcing, may indeed arc while the test is being conducted. Any arc, including microscopic arcing at contact junctions, will produce high-frequency noise that can be readily picked up by the capacitive transducer or a small antenna. Accordingly, the fifth and final general aspect of the present invention is the inclusion of a high-frequency detection means responsive to electrical arcing. The present inventor has four patents relating to the detection of electrical arcs by monitoring high-frequency noise (U.S. Pat. No. 5,223,795 issued Jun. 29, 1993; U.S. Pat. No. 5,432,455 issued Jul. 11, 1995; U.S. Pat. No. 5,434,509 issued Jul. 18, 1995; and U.S. Pat. No. 5,729,145 issued Mar. 17, 1998), and any of the techniques described therein can be used as an arc detection means.

The preferred embodiment of the present invention is a miniature, microprocessor-based diagnostic probe with an attached keyboard/display unit for use as a user interface. The probe includes a current sensing means, preferably a miniature Hall-effect transducer, that is responsive to the current flowing in the wire, and a high-frequency detection circuit responsive to arcing. In use, the microprocessor performs automatic offset compensation and can calculate and display a variety of fault parameters including the voltage drop, the power dissipation, and any arcing events.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
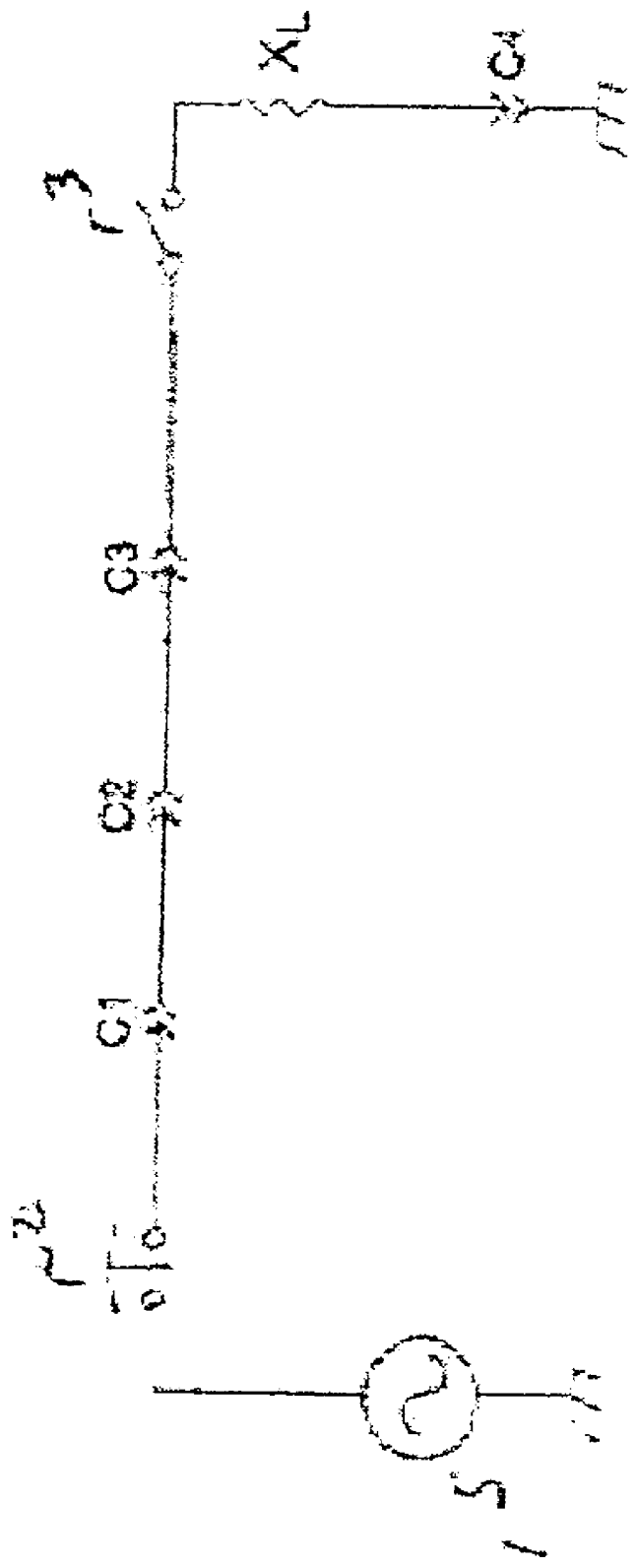
FIG. 1 is a simplified schematic of a single aircraft power distribution circuit.

FIG. 1 shows a simplified schematic of a single power distribution circuit commonly found in aircraft wiring. The power source 1, usually 120 Vrms at 400 hz, feeds through a circuit breaker 2, then typically several connectors shown as C1, C2, and C3, through a local on/off switch control 3 to the circuit load impedance $X_L$, and then through one more connectors shown as C4 to the airframe. The connections in aircraft wiring serve to accommodate modular assembly and disassembly of aircraft sections. Aircraft safety standards dictate that these connectors be high quality, aircraft-rated connectors typically with sealed wire entries. Such wiring assemblies, by design, do not permit exposed wire conductors anywhere along the length of the distribution system. In order to diagnose and locate a typical series fault, wherein one of these connections has degraded in such a manner as to produce an excessive voltage drop across the connections under load, a service technician must be able to measure successive voltage drops across the connections. If electrical contact to the contacts or the wire conductors can be made, this process of measuring the voltage drop across each contact is simple and can be done with a conventional voltmeter. Since contact cannot be made with the conductors, there exists a need for a diagnostic tool that can make these voltage drop measurements without direct contact to the conductors.

Figure 2:
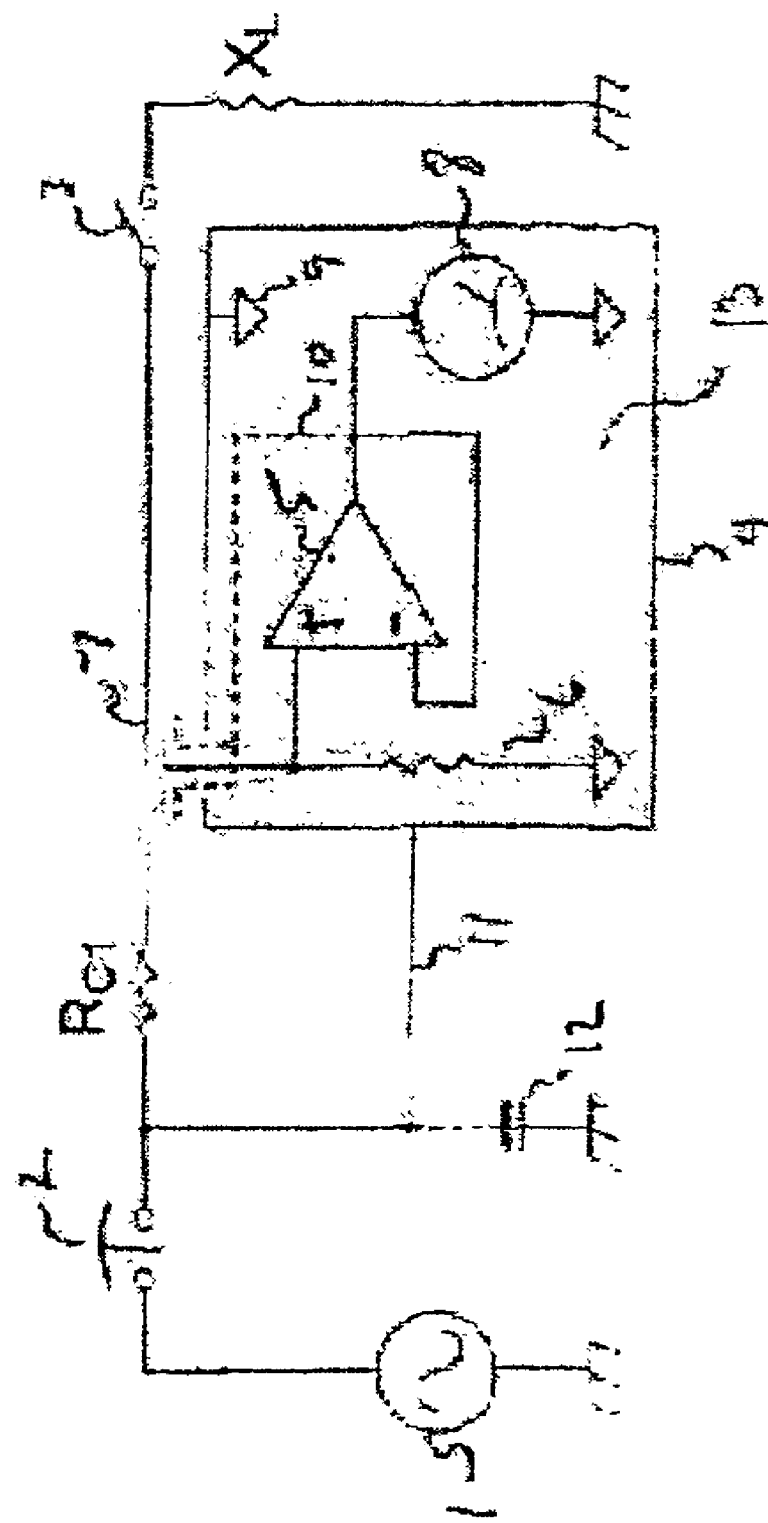
FIG. 2 shows the Series Fault Tool of the present invention monitoring a high-side fault.

Referring now to FIG. 2, the present invention accomplishes this with a capacitive probe 7 to sense the voltage drop and a floating high-impedance meter that has its ground reference 9 tied to the common-mode voltage through a wire 11. In this case the common-mode voltage is the line voltage at the circuit breaker. Two distinct advantages are gained with this approach. First, the voltage is sensed with a non-contact capacitive probe that clamps around the insulation of the conductor, eliminating the need for a direct connection. And second, the common-mode voltage is eliminated by driving the entire circuit at the line voltage. The need for and advantage of this aspect of the invention over more conventional differential amplifier approaches will be discussed in more detail in the following paragraphs.

In FIG. 2, $R_{C1}$ represents the resistance of, for example, connection C1 in FIG. 1. This resistance is the resistance under load, i.e., the resistance of connection C1 with full load current flowing. This may be substantially different than the "cold" resistance because the load current causes heating and consequent physical changes at the contact point in a degraded connection. Even a normal connection, due to limited contact area, produces a small voltage drop and consequently some heating. But acceptable voltage drops on a good connection are typically on the order of a few millivolts. Contacts that are mismatched or have otherwise degraded may produce a voltage drop of several hundred millivolts or even several volts before the load malfunctions to the extent that the fault becomes evident.

Referring still to FIG. 2, the Series Fault Tool 13 is a handheld, battery-powered test instrument comprising a shielded, high-impedance amplifier 5 having an input resistance 6, a capacitive probe 7, an output measuring and display means 8, and an electrostatic shield 4 that surround the entire circuit. The circuit common 9 is connected to this shield, and this shield is connected to the line voltage through a wire 11. In this manner, the circuit common 9 of the floating circuit is driven at the line voltage, making the measurement through capacitance 7 a single-ended, direct measurement of the voltage drop across $R_{C1}$. The wire 11 that connects to the line voltage can be a simple insulated wire with a clip to connect to the circuit breaker terminal. Stray capacitance 12 from this wire or the shielded enclosure 4 has no effect on the measurement because it is driven by the line, which is a low impedance source. Any stray capacitance from the input at capacitive sensor 7 to the airframe does produce an error and will be discussed in more detail later.

Figure 3:
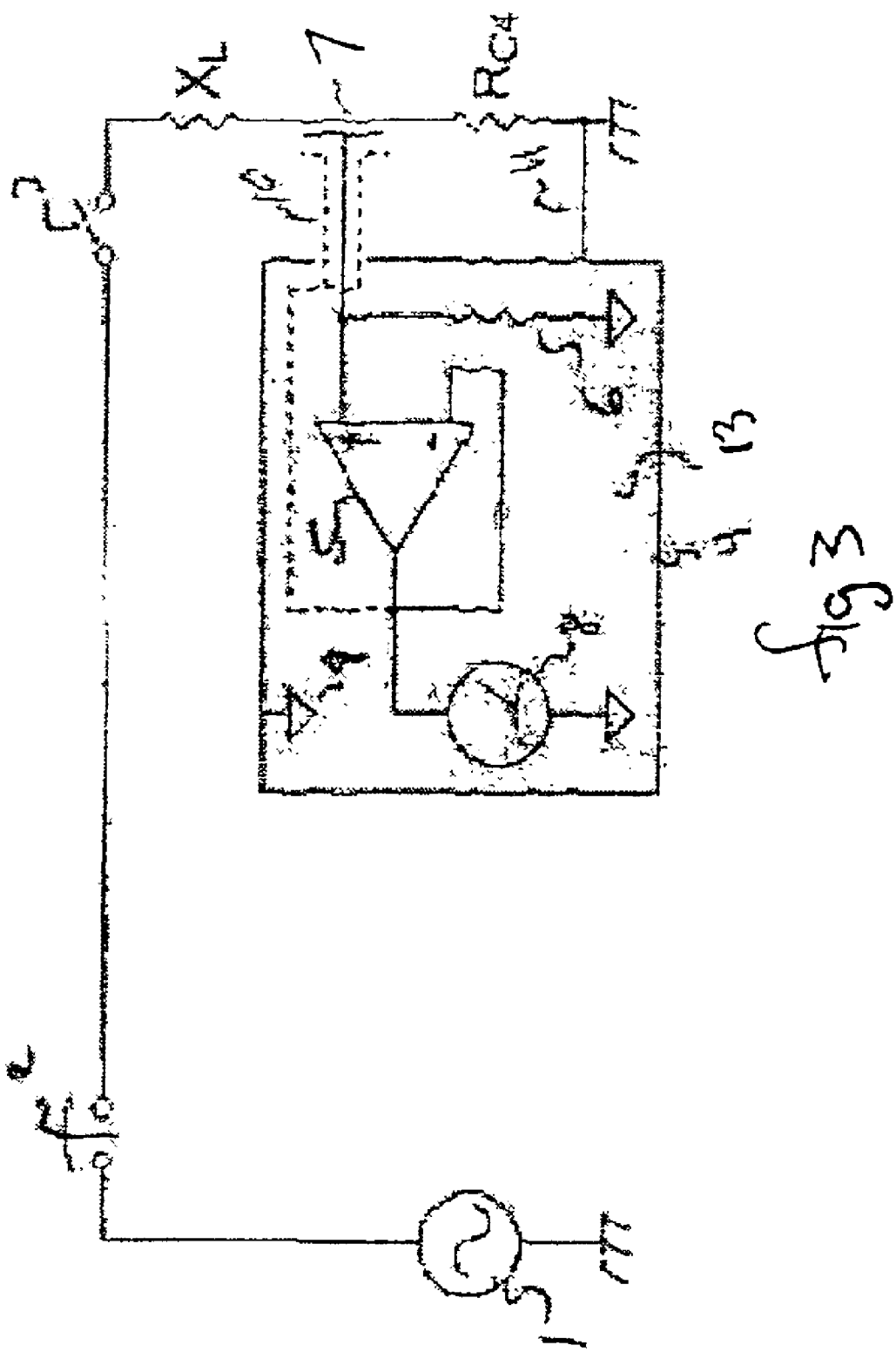
FIG. 3 shows the Series Fault Tool of the present invention monitoring a low-side fault.

Referring now to FIG. 3, the same Series Fault Tool 13 is shown connected to measure the voltage drops on the return side of the load. In this case the reference wire 11 is connected to the airframe instead of to the line voltage. The voltage measured is again the actual voltage drop across the connections, but in this case the common-mode voltage is zero.

This method of driving the case to the common-mode voltage and taking a single-ended measurement of the voltage drop is not obvious. A conventional approach to the problem of measuring these voltage drops through capacitive probes would be to use a high-impedance differential amplifier, having a common-mode range equal to or greater than the line voltage, and make a differential measurement. The present inventor has tried this approach and found that even though the circuit common-mode rejection ratio can be made sufficient to get accurate readings, the effect of stray capacitances on the common-mode rejection makes this approach impracticable.

Figure 4:
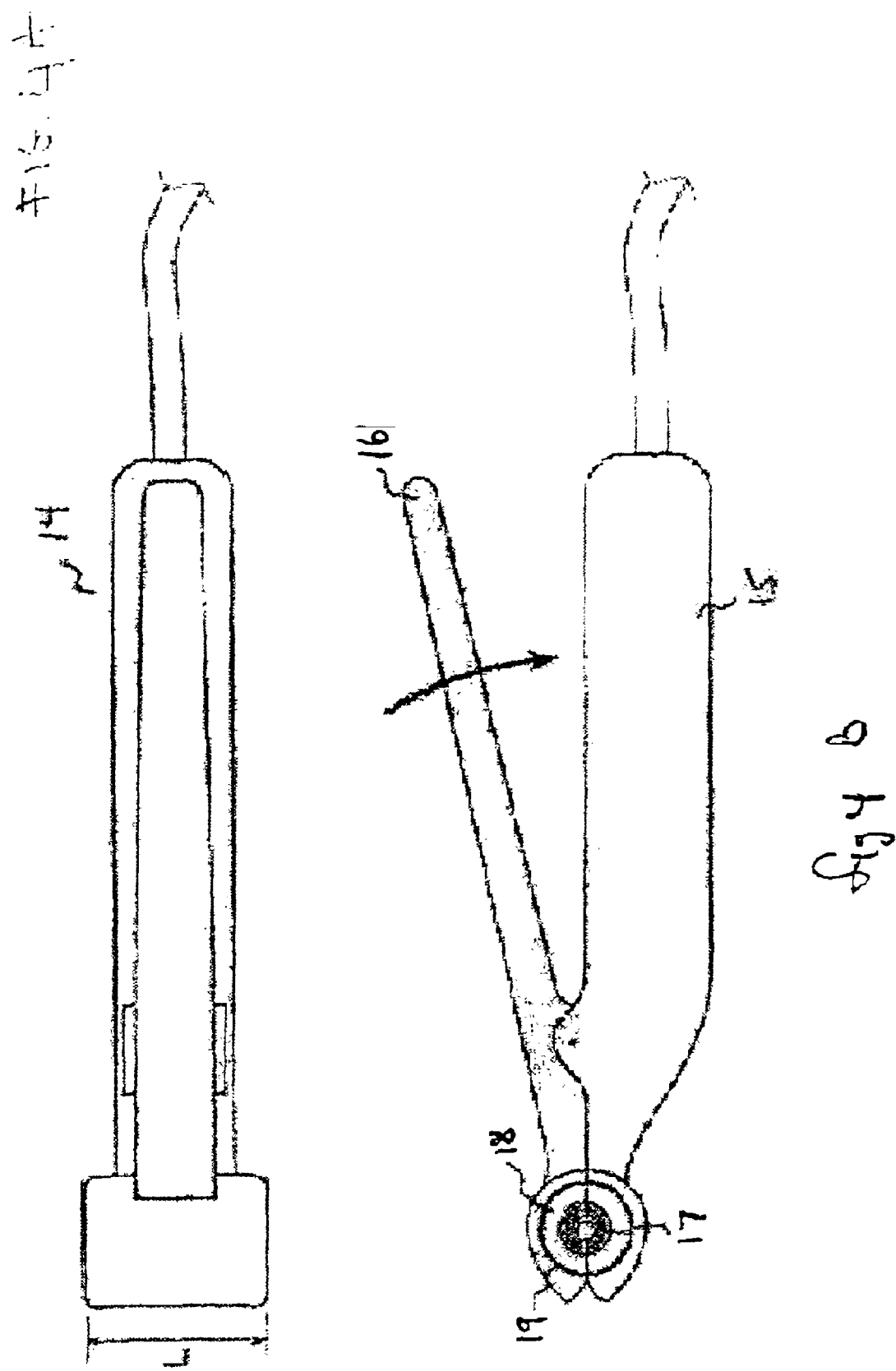
FIG. 4A is a plan view of a capacitive clamp probe according to one embodiment of the present invention.
FIG. 4B is a side view of the capacitive clamp probe according to one embodiment of the present invention.

FIG. 4 shows a simplified mechanical representation of one possible version of the capacitive clamp according to the present invention. Both a top view 14 and side view 15 are shown. A handle 16 is provided that when pressed opens the jaws to allow placing the clamp around a cable. A conductive, flexible material 17 compresses around the outer insulation of the cable to accommodate various size wires. The purpose of this flexible conductor is to make intimate contact with the wire insulation and thereby maximize the capacitance between this material and the center conductor of the wire. The flexible material may be a soft conductive polymer foam or a conductive metal mesh or any other means by which intimate contact can be made. A second layer of insulating material 18 serves to isolate the center conductor from a third conductive layer 19 which serves as an electrostatic shield. The outer layer is the plastic enclosure 15 that contains the assembly and serves to isolate the shield 19 from the user. The layers shown are not drawn to scale, in order to facilitate identifying the components. Also, for simplicity, end shields that serve to shield the ends of the clamp are not shown. The amplifier circuitry is contained within an electrostatic shield within the handle assembly 15. It will be appreciated that a wide variety of mechanical designs can be implemented to make a shielded capacitive clamp that is capable of accommodating a range of wire sizes.

Figure 5:
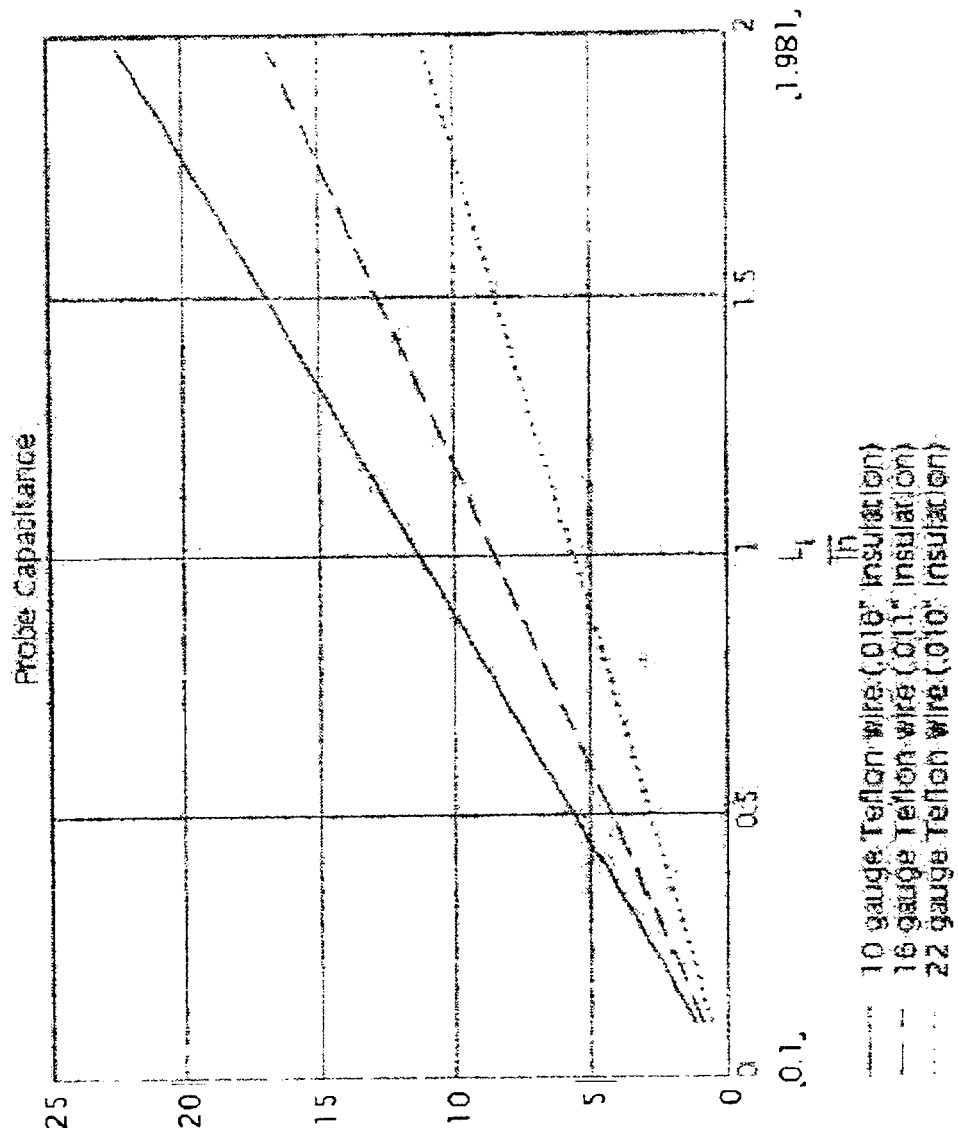
FIG. 5 is a plot of the probe capacitance versus probe width for three different wire gauges.

Assuming that intimate contact is made to the outer insulation, FIG. 5 shows a plot of coupling capacitance versus the length of the probe, labeled as L in FIG. 4, for three different wire gauges. The vertical axis is probe capacitance in picofarads (pf), and the horizontal axis is the length of the capacitive probe. The top solid line is a 10 gauge stranded wire with 0.016 inch thick Teflon insulation. The middle dashed line is for a 16 gauge stranded wire with 0.011 inch thick Teflon insulation, and the lower dotted line shows the capacitance versus length for a 22 gauge stranded wire with 0.010 inch thick Teflon insulation. As can be seen, the capacitance is highest for the larger gauge wire, and at 1 inch length, it ranges from about 6 pf for a 22 gauge wire to 12 picofarads for a 10 gauge wire. A variety of different probe lengths and designs can be made available to meet the needs of particular applications.

Figure 6:
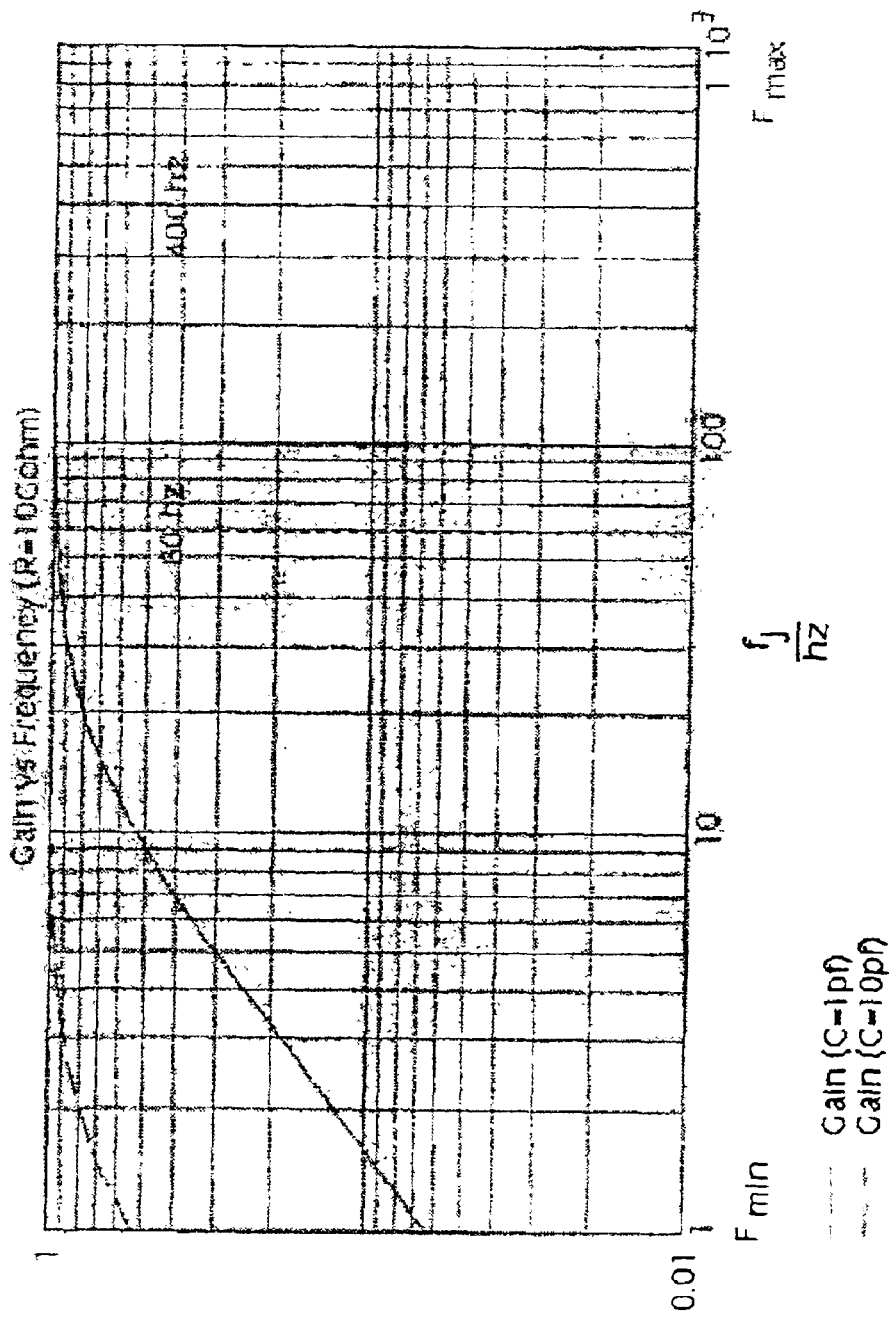
FIG. 6 is a plot of the probe gain versus frequency for two different probe capacitances.
Figure 7:
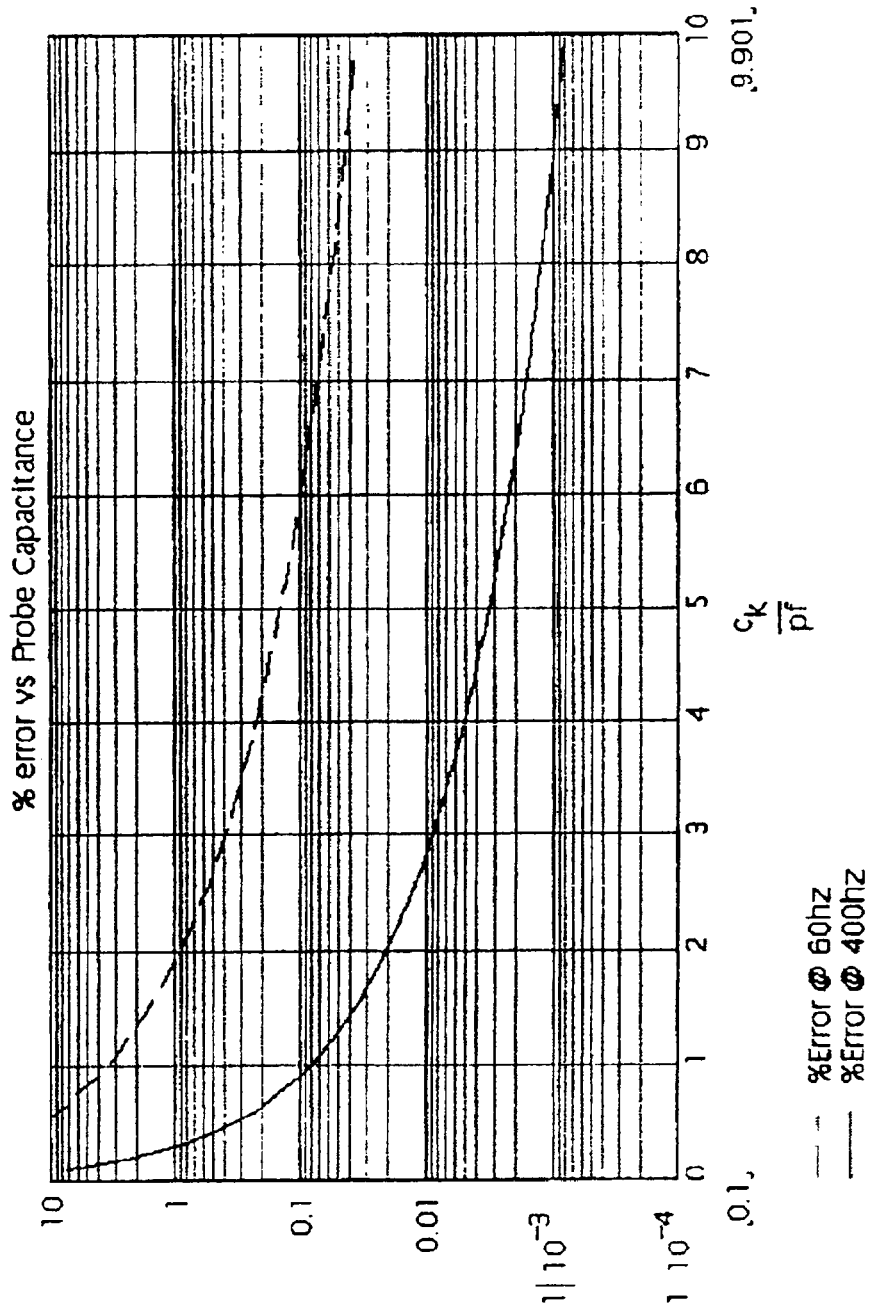
FIG. 7 is a plot of the voltage gain error versus probe capacitance.

The coupling capacitance of the probe together with the input impedance of the amplifier form a high-pass filter, and the corner frequency of this filter should be substantially lower than the line frequency in order to pass the line frequency unattenuated. The higher the input impedance, the lower the corner frequency. Today it is relatively simple and inexpensive to build an amplifier with an input impedance of 10 Gohms. As is well known to anyone skilled in the art, the input bias current of the amplifier is the primary limiting factor because this bias current times the input resistor causes an offset voltage. Electrometer-grade operational amplifiers, such as the OPA128 from Burr-Brown Corporation, have a maximum bias current of only ±75 femtoamperes which produces an offset of only ±750 microvolts. FIG. 6 shows a plot of the gain versus frequency for both a 1 pf and a 10 pf coupling capacitance. The vertical axis is transfer gain, and the horizontal axis is the log frequency. The upper trace is the gain with a 10 pf probe capacitance, and the lower trace is the gain with a 1 pf probe capacitance. The high-pass characteristic is evident and even the lower 1 pf coupling capacitance is close to flat response at 60 hz line frequency. FIG. 7 shows the amplitude error produced by this attenuation for both 60 hz and 400 hz applications. The vertical axis is percent amplitude error, and the horizontal axis is probe capacitance in picofarads. At 400 hz, the typical line frequency in aircraft applications, the amplitude error is less than 1% with any coupling capacitance over about 0.3 pf. It is clear from this plot that accuracies on the order of 1% can be maintained even as the probe capacitance varies over a large range.

Figure 8:
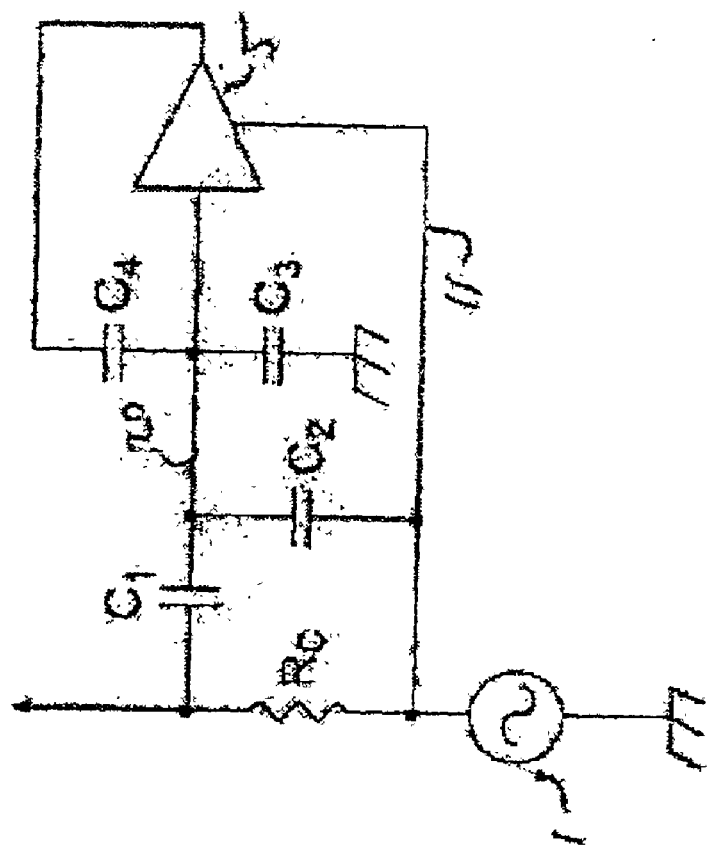
FIG. 8 is an equivalent circuit of the various capacitances that affect the probe measurement.

The dominant error therefore results from stray capacitive coupling, and this can best be understood with reference to FIG. 8, which is an equivalent circuit that shows the various capacitors involved. $C_1$ is the coupling capacitance of the probe, which is on the order of 1–10 pf. The circuit common 11 of amplifier 5 is connected to the line voltage and an electrostatic shield around the entire circuit as discussed previously. $C_2$ is the capacitance between the input line 20 and this circuit common 11. If the shield 19 (FIG. 4) around the capacitive probe itself is connected to this circuit common 11, then the capacitance formed between the shield 19 (FIG. 4) and the center flexible conductor 17 (FIG. 4) is represented by capacitor $C_2$. As can be seen, $C_2$ acts with $C_1$ as a voltage divider and attenuates the signal. In many potential probe designs, for reasons of compactness, it is advantageous to make the insulating layer 18 (FIG. 4) as thin as possible, thereby increasing the capacitance $C_2$. An improvement on the design, therefore, is to drive the probe shield 19 (FIG. 4) with a signal that is nearly equal to the measured signal, easily obtained by using the output of the buffer amplifier 5, and in this manner guard the input line 20. The gain of the buffer must be slightly less than 1 in order to prevent oscillation. In this case, $C_2$ becomes diminishingly small, being only the stray capacitance between the input 20 and the shield, and $C_4$ now represents the shield capacitance. But since the voltage is nearly the same on each side of $C_4$, the effect of the capacitance is nearly eliminated. This allows the design of probes with a very thin shield layer.

Capacitor $C_3$ in FIG. 8 is the stray capacitance from the input lead 20 to the airframe in 400 hz applications or to the ground in 60 hz applications. This capacitance is the major error source because the entire line voltage is imposed across it. The only way to minimize conductance through this capacitor is to reduce the exposure of the input line 20 to the airframe or ground. For this reason, the amplifier 5 and probe assembly must be completely shielded. The effectiveness of this shielding in specific mechanical implementations determines how much leakage current will flow though $C_3$ and consequently how much offset voltage will be measured at zero voltage drop. As discussed previously, this offset voltage can be simply compensated for by measuring the voltage drop with no current flowing, i.e., the load switched off, recording the offset voltage, and then subtracting this voltage from the reading with the load current flowing.

Figure 9:
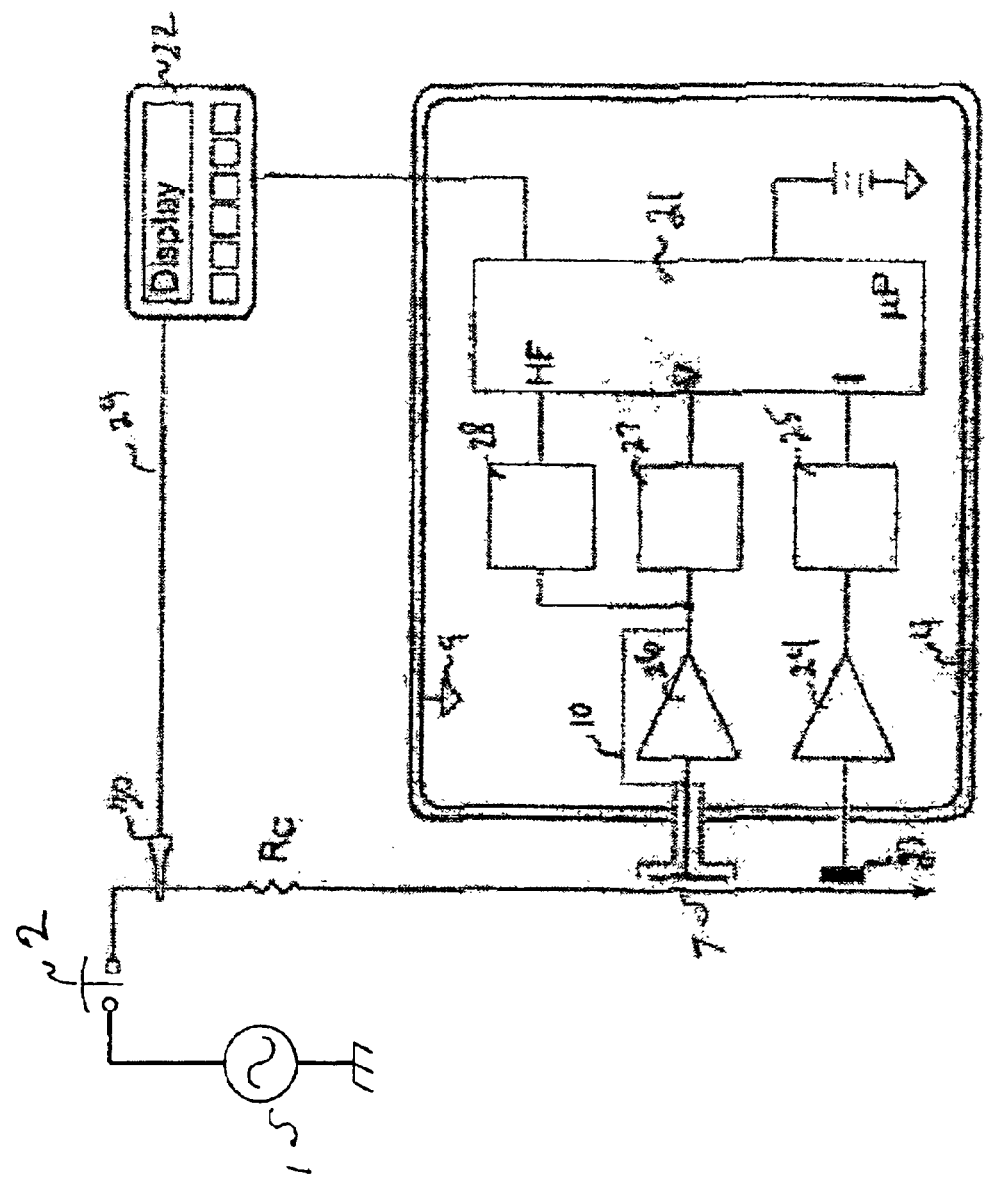
FIG. 9 is a block diagram of the preferred embodiment of the present invention.

The preferred embodiment of the present invention is shown in the block diagram of FIG. 9. A microprocessor system 21 serves to convert the input signals to digital form and process the measurements into meaningful data and user indications. A display/keyboard unit 22 serves as the user interface and may be separate from the probe to facilitate easy viewing. An extendable wire 29 connects the circuit common 9 to the line using a convenient clip means 30. In some cases it may be advantageous to place the microprocessor in the keyboard/display unit or to integrate the entire assembly including the display into the probe itself. In this embodiment, a current-sensing means 23 is added to the capacitive probe 7. This current sensor is preferably a Hall-effect sensor, because the small size of such a sensor allows it to be readily placed within the probe. Alternatively, it could be a simple split-core magnetic current transformer or a split-core magnetic loop with the Hall-effect transducer interposed within the magnetic path. The current sensor 23 feeds an amplifier 24 and signal conditioning circuits 25 to produce a voltage that is proportional to the instantaneous current flowing. The capacitive sensor 7 feeds first an amplifier 26 and then signal processing circuits 27 to produce a voltage that is proportional to the instantaneous voltage present. The capacitive sensor also feeds a high-frequency detection circuit 28 that is responsive to the presence of electrical arcing. The simplest method for arc detection is a simple comparator circuit responsive to fast edges indicative of arcing, as discussed in the present inventor's previous patents. Other more extensive approaches can be implemented as required.

The microprocessor 21 mathematically processes the instantaneous voltage and current readings to calculate the running voltage across $R_c$, and the power dissipated in $R_c$. The microprocessor can, of course, calculate the peak voltage or power over time, or the rms voltage, the resistance, the resistance versus load current, or whatever other derived parameters might be of interest in a particular application. The microprocessor 21 also monitors for the presence of arcing and provides indications to the user if it occurs.

The inclusion of current measuring capability allows the microprocessor to automate the offset correction process. For example, the probe can first be connected to the wire downstream of the connections in question and the microprocessor put into an automatic mode. The operator can go and sequence the load(s) on and off while the microprocessor continuously monitors the voltage drop and current, compensating automatically for any offset that might be present. When the operator returns, the microprocessor can make available through the user interface a number of calculated parameters of interest. Implementing such diagnostic routines can be readily done by anyone skilled in the art.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A device for locating a series arc fault at one or more series connections having a first end and a second end, the first end of the connections being coupled to a source of common-mode voltage and the second end of the connections being coupled to a wire, the wire having a conductive layer and a insulation layer for sheathing the conductive layer, the device comprising:

an electrode electrically coupled to the source of common-mode voltage at a first node, thereby providing a reference based on the common-mode voltage;

a probe adapted for clamping to the wire at a second node, thereby forming a coupling capacitance to electrically couple the probe to the wire; and a measuring circuit being coupled to the probe and being coupled to the electrode so as to measure an AC voltage between the first node and the second node to detect and locate the series arc fault.

2. The device of claim 1, wherein the probe includes a first conductive layer and wherein the coupling capacitance electrically couples the first conductive layer of the probe to the conductive layer of the wire.

3. The device of claim 2, wherein the probe includes a second conductive layer and a first insulation layer, the first insulation of the probe being interposed between the second conductive layer of the probe and the first conductive layer of the probe, the second conductive layer being defined as a probe shield for shielding the first conductive layer of the probe from parasitic capacitance.

4. The device of claim 3, wherein the shield is driven by a guard voltage, the guard voltage having a level being nearly equal to the measured AC voltage, and thereby compensating for the undesired capacitance produced by the second conductive layer.

5. The device of claim 1, wherein the device includes means for measuring an offset voltage that causes error in the measured AC voltage, the measuring means being adapted to normalize the measured AC voltage based on the offset voltage.

6. The device of claim 1, wherein the device includes a circuit means to measure the high-frequency noise produced by the series arc fault.

7. The device of claim 1, wherein the probe is encased in a nonconductive material to protect a user from electric shocks.

8. The device of claim 1, wherein the measuring circuit is housed in a chamber acting as an electrostatic shield, the chamber being electrically coupled to the electrode.

9. The device of claim 1, wherein the measuring circuit includes an amplifier having a high impedance to inhibit the measured AC voltage from changing significantly when the coupling capacitance changes.

10. The device of claim 1, wherein the coupling capacitance is greater than about 1 picofarads and less than about 10 picofarads.

* * * * *